(12) United States Patent
Kondo et al.

(10) Patent No.: US 7,453,532 B2
(45) Date of Patent: Nov. 18, 2008

(54) DISPLAY DEVICE

(75) Inventors: Yasuaki Kondo, Mobara (JP); Tsutomu Sato, Mobara (JP); Kosuke Matsubara, Ichihara (JP); Toshimitsu Matsudo, Shinagawa (JP)

(73) Assignee: Hitachi Displays, Ltd., Chiba (JP)

( * ) Notice: Subject to any disclaimer, the term of this patent is extended or adjusted under 35 U.S.C. 154(b) by 424 days.

(21) Appl. No.: 11/116,300

(22) Filed: Apr. 28, 2005

(65) Prior Publication Data
US 2005/0243239 A1    Nov. 3, 2005

(30) Foreign Application Priority Data
Apr. 30, 2004   (JP)   ............................. 2004-135431

(51) Int. Cl.
*G02F 1/1333*   (2006.01)
*G02F 1/1345*   (2006.01)

(52) U.S. Cl. ........................... 349/58; 349/60; 349/149; 349/151; 349/152; 361/681

(58) Field of Classification Search ................... 349/58, 349/60–63, 149–152; 361/681
See application file for complete search history.

(56) References Cited

U.S. PATENT DOCUMENTS

| 6,825,894 | B2 * | 11/2004 | Aoyagi et al. | 349/61 |
| 2006/0285353 | A1 * | 12/2006 | Kim | 362/561 |
| 2007/0236874 | A1 * | 10/2007 | Jeong | 361/681 |
| 2007/0258198 | A1 * | 11/2007 | Minaguchi et al. | 361/681 |

* cited by examiner

*Primary Examiner*—Julie Ngo
(74) *Attorney, Agent, or Firm*—Antonelli, Terry, Stout & Kraus, LLP.

(57) ABSTRACT

The present invention provides a technique that is capable of preventing a separation of elements of the display panel of a slim display device in which the bending radius of a flexible printed circuit is small. A flexible printed circuit connects to a first side of the display panel proximate to an end surface of the display panel and is bent in the vicinity of the end surface, and a part of the flexible printed circuit is disposed between the back of a backlight and a holder. The holder has an opening or a depression in the vicinity of an end surface of the backlight corresponding to the end surface of the display panel. The flexible printed circuit has a portion which is deflected so that a portion thereof projects into a space in the opening or the depression in the holder, as viewed in section.

7 Claims, 7 Drawing Sheets

DISPLAY DEVICE

The present application claims priority from Japanese application JP2004-135431, filed on Apr. 30, 2004, the content of which is hereby incorporated by reference into this application.

BACKGROUND OF THE INVENTION

The present invention relates in general to a display device, and, in particular, it relates to a technique that is effective in achieving a slim display device.

Liquid-crystal display modules having a compact liquid-crystal display panel (for example, a TFT liquid-crystal display panel) are used as display devices in cellular phones.

FIG. 12 is a developed perspective view of a conventional liquid-crystal display module of the type used as the display device of a cellular phone and so on. FIG. 13 is a sectional view of the module taken along the line A-A' in FIG. 12.

As shown in FIGS. 12 and 13, the liquid-crystal display modules that are conventionally used as display devices in cellular phones etc. have a layered structure in which a liquid-crystal display panel (LCD) and a backlight (BL) are arranged in this order in a die cast frame (LCA). Between the liquid-crystal display panel (LCD) and the backlight (BL), a double-coated spacer (SPA) is disposed, with which the liquid-crystal display panel (LCD) is fixed to the backlight (BL).

On one side of the liquid-crystal display panel (LCD), a driver (DRV) having semiconductor chips for driving subpixels in the liquid-crystal display panel (LCD) is disposed. To the side of the liquid-crystal display panel (LCD) proximate to an end surface of the liquid crystal display panel, one end of a flexible printed circuit (FPC) is connected. The flexible printed circuit (FPC) is bent in the vicinity of the end surface of the liquid-crystal display panel (LCD), the other end of which is disposed between the backlight (BL) and the die cast frame (LCA).

Circuit components (CIRs) are mounted on the part of the flexible printed circuit (FPC) which is disposed between the backlight (BL) and the die cast frame (LCA) and at a location which corresponds to a hole 10 in the die cast frame (LCA).

SUMMARY OF THE INVENTION

There has been a recent demand to reduce the thickness of the liquid-crystal display modules shown in FIGS. 12 and 13.

As described above, the flexible printed circuit (FPC) connects to one side of the liquid-crystal display panel (LCD) at one end surface thereof and is bent in the vicinity of the end surface of the liquid-crystal display panel (LCD), and it is disposed between the backlight (BL) and the die cast (LCA) at the other end thereof. Accordingly, for example, when the backlight (BL) is made slim to decrease the thickness of the liquid-crystal display module, the bending radius of the flexible printed circuit (FPC) necessarily becomes small as a consequence. This increases the expanding stress (hereinafter referred to as returning stress) of the flexible printed circuit (FPC), as shown by arrows A and A' in FIG. 14.

When the returning stress increases, the stripping stress relative to the double-coated spacer (SPA), which serves to fix the liquid-crystal display panel (LCD) to the backlight (BL), or the stripping stress at the end of the flexible printed circuit (FPC), is increased. When the stripping stress relative to the double-coated spacer (SPA), which serves to fix the liquid-crystal display panel (LCD) to the backlight (BL), becomes larger than the bonding strength of the double-coated spacer (SPA), the liquid-crystal display panel (LCD) may disadvantageously lift up and separate from the backlight (BL).

Also, when the stripping stress at the end of the flexible printed circuit (FPC) becomes larger than the bonding strength between the end of the flexible printed circuit (FPC) and the liquid-crystal display panel (LCD), the end of the flexible printed circuit (FPC) may lift up from the liquid-crystal display panel (LCD), so that the conductivity between the terminal of the flexible printed circuit (FPC) and the terminal of one substrate (glass substrate) of the liquid-crystal display panel (LCD) will be lost, thus affecting the reliability of the display device.

The present invention has been made to solve the above-described problems. Accordingly, an object of the present invention is to provide a technique which is capable of preventing a separation of elements of the display panel of a slim display device in which the bending radius of the flexible printed circuit is small.

Another object of the present invention is to provide a technique capable of preventing a lifting-up of the flexible printed circuit of a slim display device in which the bending radius of the flexible printed circuit is small.

The above and other objects of the present invention will be apparent from the following description of the preferred embodiments and from the attached drawings.

The invention will be briefly described below.

To achieve the above-described objects, the present invention comprises a display panel, a flexible printed circuit, and a holder that holds the display panel and the flexible printed circuit. The flexible printed circuit is connected to a first side of the display panel proximate to an end surface of the display panel and a portion thereof is bent in the vicinity of the end surface, which portion is disposed between the display panel and the holder. The holder has an opening or a depression in the vicinity of the end surface of the display panel. The flexible printed circuit has a portion which is deflected so that part of the flexible printed circuit projects into the opening or the depression.

The advantages of the present invention will be briefly described below.

(1) The invention provides a technique which is capable of preventing a separation of elements of the display panel of a slim display device in which the bending radius of the flexible printed circuit is small.

(2) The invention provides a technique which is capable of preventing a lifting-up of the flexible printed circuit of a slim display device in which the bending radius of the flexible printed circuit is small.

BRIEF DESCRIPTION OF THE DRAWINGS

FIG. 12 is a developed perspective view showing the structure of a conventional liquid-crystal display module of the type used as the display device of a cellular phone and so on.

DESCRIPTION OF THE PREFERRED EMBODIMENTS

Figure 1:
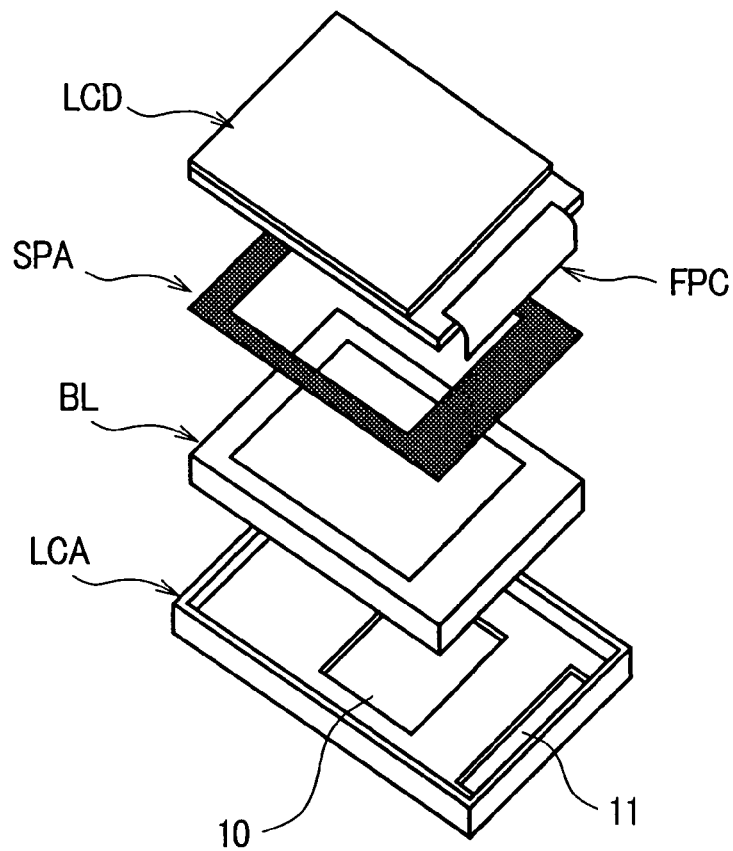
FIG. 1 is a developed perspective view showing the structure of a liquid-crystal display module according to a first embodiment of the present invention.

The present invention will be described in detail below, based on various embodiments, with reference to the attached drawings.

Components that have the same function are given the same reference numerals, and a repeated description thereof will be omitted.

First Embodiment

Figure 2:
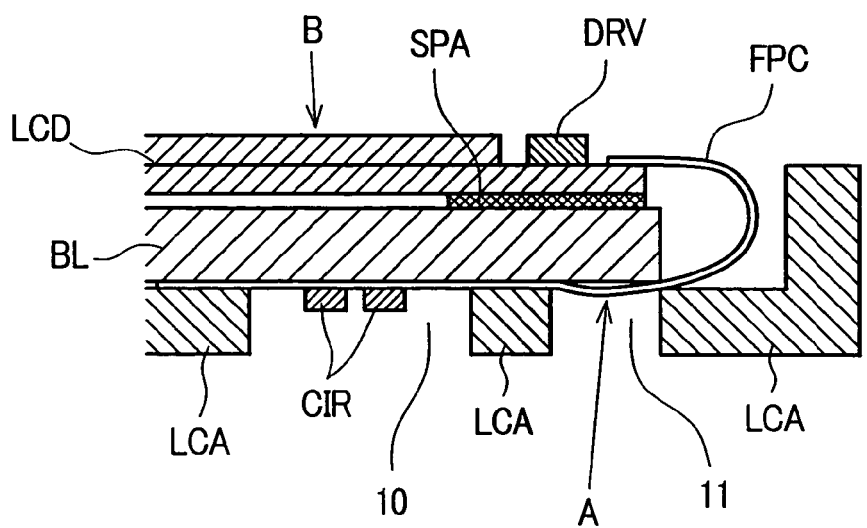
FIG. 2 is a sectional view showing one end of the liquid-crystal display module according to the first embodiment.
Figure 13:
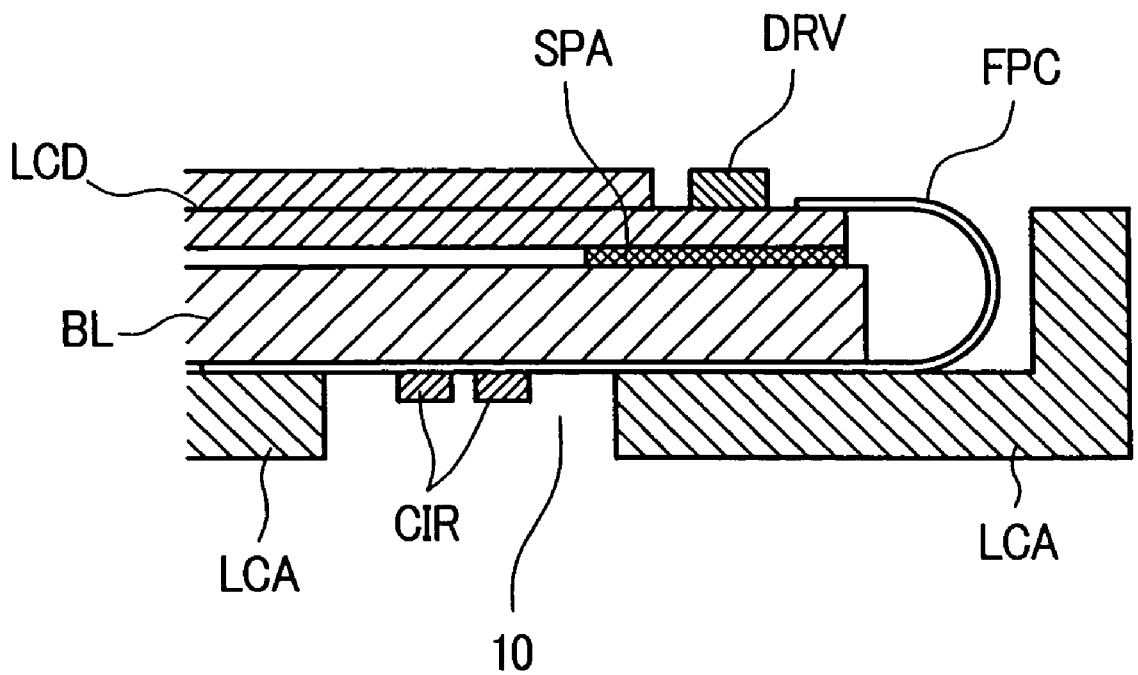
FIG. 13 is a sectional view of the module taken along the line A-A' in FIG. 12.
Figure 14:
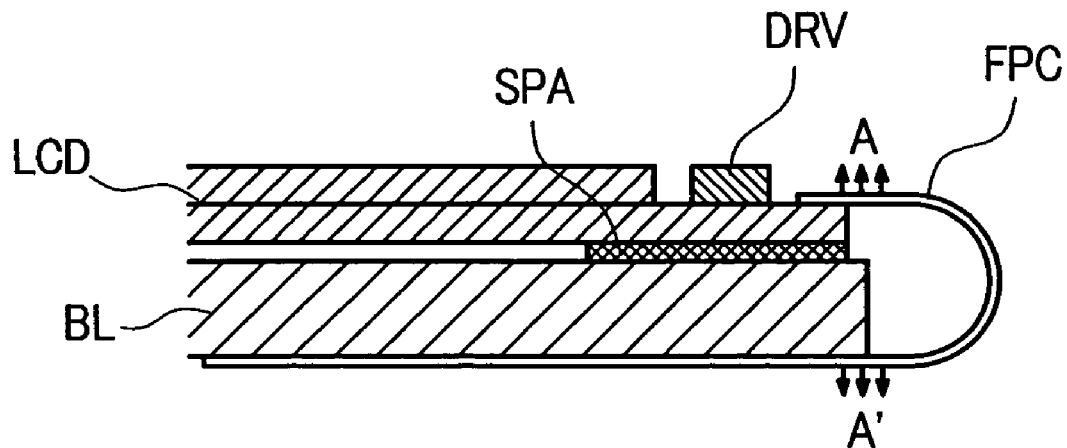
FIG. 14 is a diagram which illustrates the problems of the conventional liquid-crystal display module.

FIG. 1 is a developed perspective view showing the structure of a liquid-crystal display module according to a first embodiment of the present invention; and FIG. 2 is a sectional view of one side of the liquid-crystal display module according to the first embodiment, showing the same portion as that of FIG. 13.

The liquid-crystal display panel (LCD) is constructed such that a glass substrate (TFT), including a thin-film transistor, a drain line, a gate line, etc., and a glass substrate (CF), including a counter electrode, a color filter, etc., are bonded together via a sealing agent, between which liquid crystal is sealed. Since the structures of the glass substrate (TFT) and the glass substrate (CF) have no relation to the invention, a more detailed description thereof is omitted here.

Figure 12:
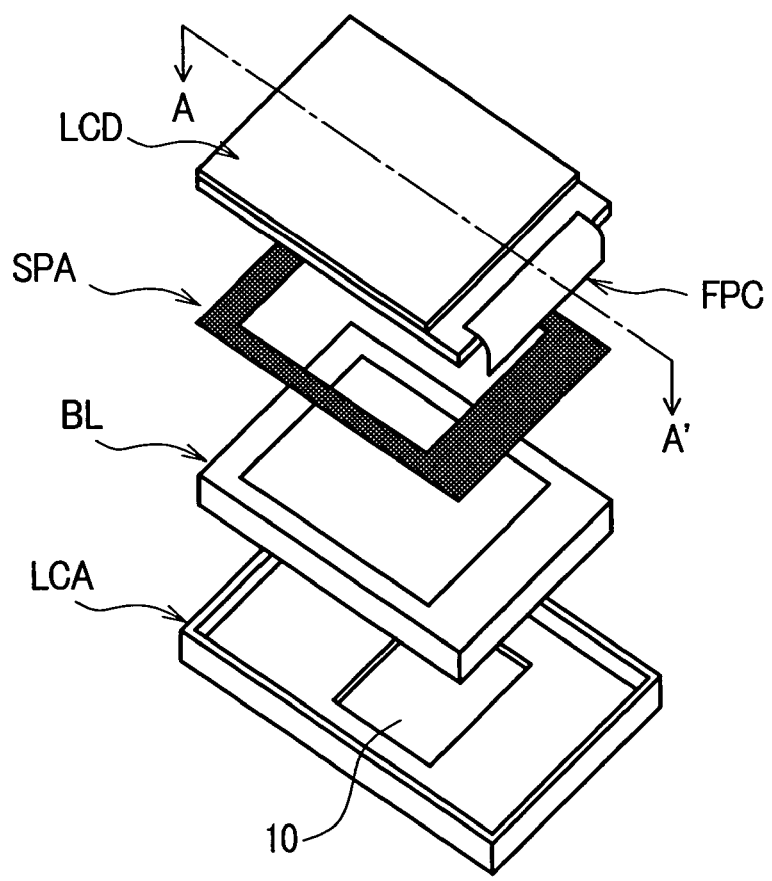

This embodiment is different in construction from the conventional liquid-crystal display module shown in FIGS. 12 and 13 in that the die cast frame (LCA) (also referred to as a holder) has an additional hole (opening) 11.

In this embodiment, the flexible printed circuit (FPC) has a portion which is formed in the area of the hole 11 in the die cast frame (LCA) so as to project into the hole 11. Thus, in this embodiment, the above-described returning stress can be absorbed even when the liquid-crystal display module is made slim, causing the bending radius of the flexible printed circuit (FPC) to be small. Accordingly, the liquid-crystal display panel (LCD) is prevented from lifting up from the backlight (BL), or the end of the flexible printed circuit (FPC) is prevented from lifting up from the liquid-crystal display panel (LCD).

It is apparent from the foregoing description that the embodiment may have either a hole or a depression in place of the hole 11 formed in the die cast frame (LCA).

Figure 4:
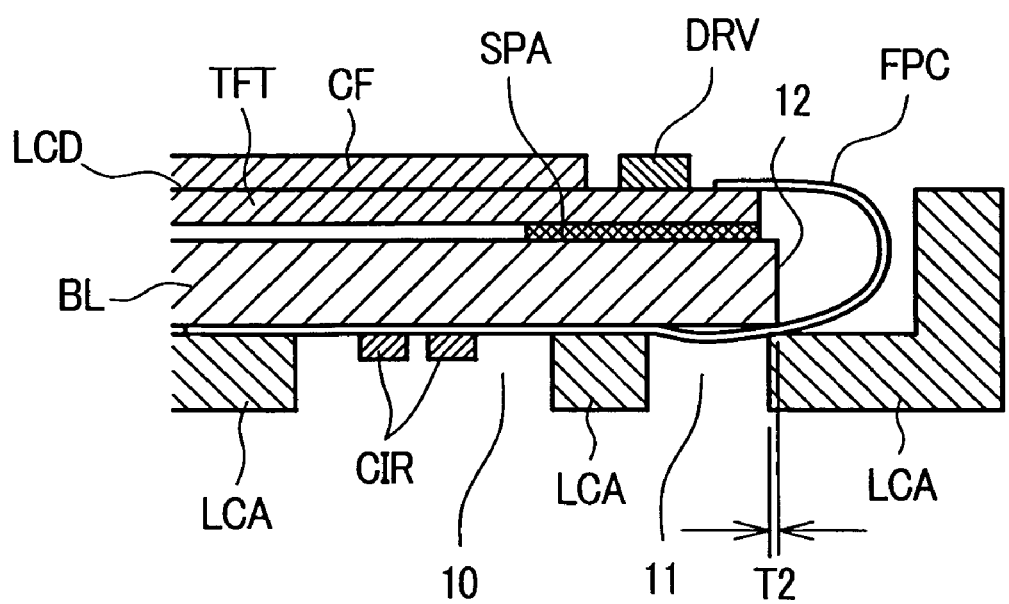
FIG. 4 is a sectional view showing another modification of the liquid-crystal display module according to the first embodiment.

In a modification of the embodiment of the invention, the hole 11 is located such that the hole 11 does not extend to with the end surface 12 of the backlight (BL), corresponding to the terminal side of the glass substrate (TFT) of the liquid-crystal display panel (LCD), as seen in plan view (as viewed from the direction of arrow B in FIG. 2). In this case, as shown in FIG. 4, it is preferable that the distance (T2 in FIG. 4) between the end of the hole 11 adjacent to the end surface 12 of the backlight (BL) and the end surface 12 of the backlight (BL) be within 2 mm.

Figure 3:
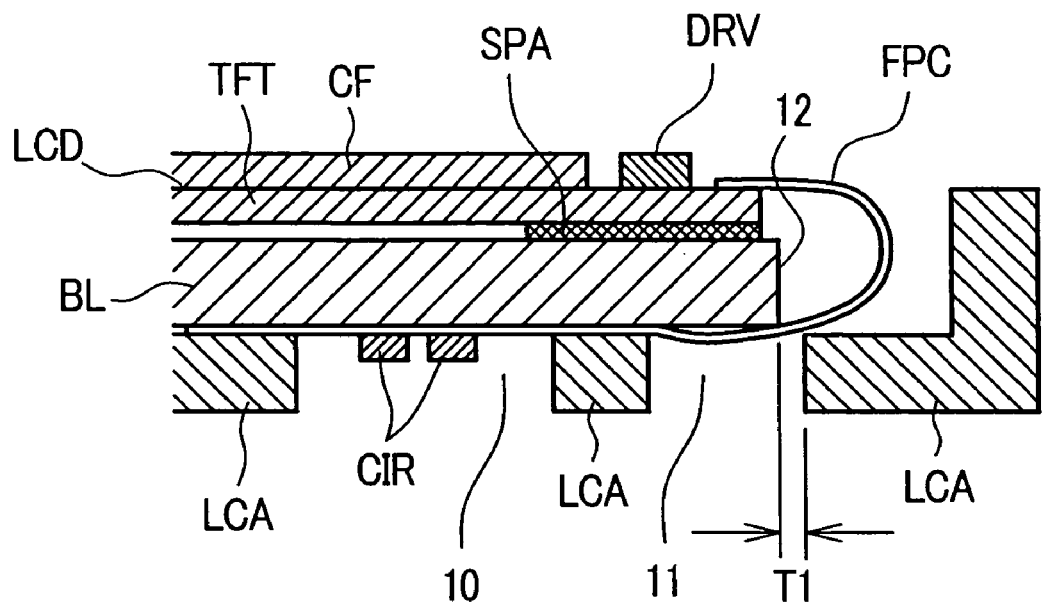
FIG. 3 is a sectional view showing a modification of the liquid-crystal display module according to the first embodiment.

In another modification of the embodiment, the hole 11 is located so as to extend beyond the end surface 12 of the backlight (BL) in plan view. In this case, as shown in FIG. 3, it is preferable that the distance (T1 in FIG. 3) between the end of the hole 11 outside the backlight (BL) and the end surface 12 of the backlight (BL) be within 4 mm.

In this embodiment, between the glass substrate (TFT) of the liquid-crystal display panel (LCD) and the backlight (BL), a double-coated spacer (SPA) is disposed, with which the liquid-crystal display panel (LCD) is fixed to the backlight (BL). Alternatively, another fixing means may be used in place of the double-coated spacer (SPA). In this case, a non-adhesive spacer may be provided, or alternatively, the spacer may be omitted. The same is true for the following embodiments.

Second Embodiment

Figure 5:
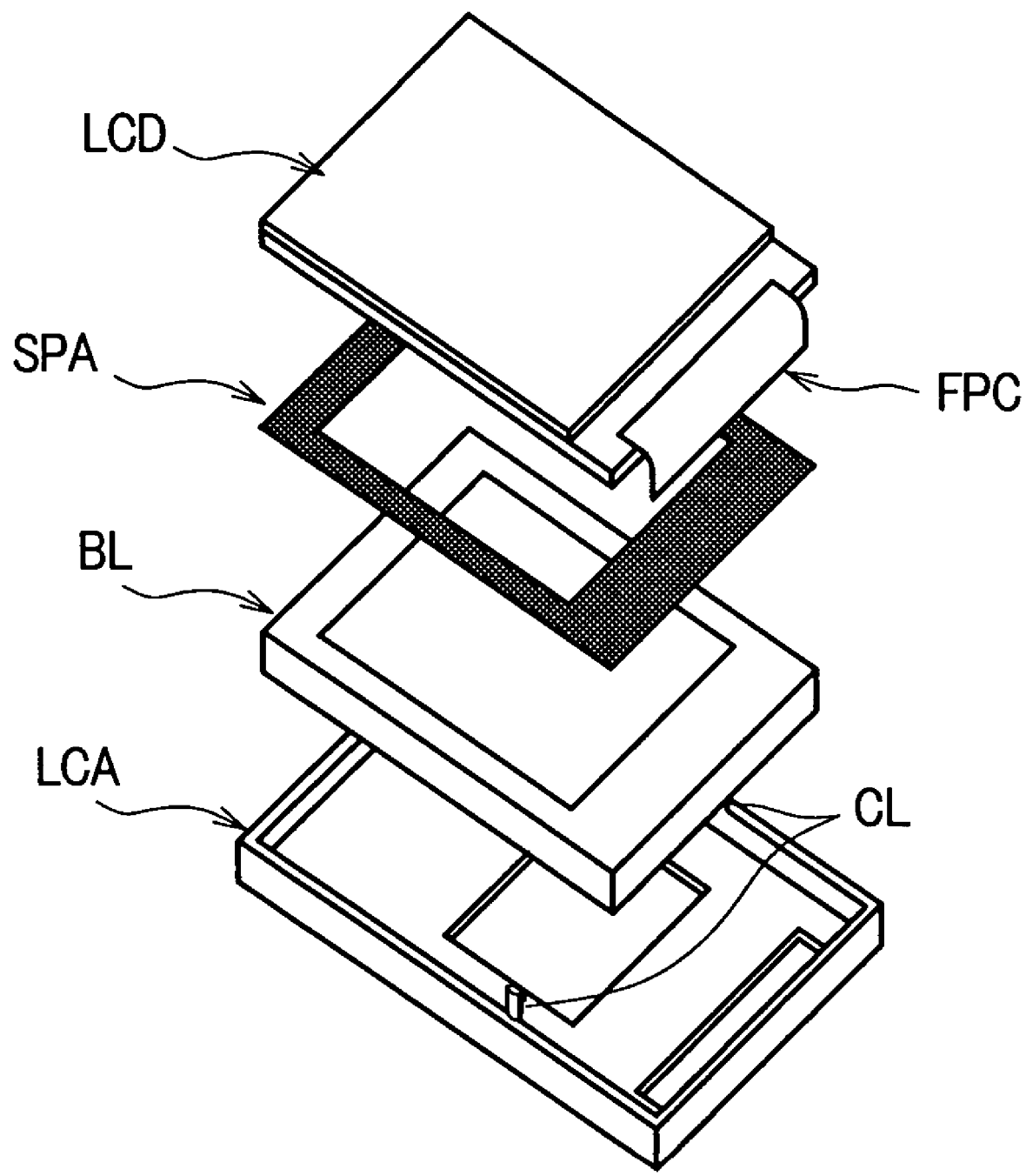
FIG. 5 is a developed perspective view showing the structure of a liquid-crystal display module according to a second embodiment of the present invention.

FIG. 5 is a developed perspective view showing the structure of a liquid-crystal display module according to a second embodiment of the invention.

The liquid-crystal display module of this embodiment is different in construction from the liquid crystal display module according to the first embodiment in that the die cast frame (LCA) has claws (CLs) with which the liquid-crystal display panel (LCD) is fixed. The other structural features are the same as those of the first embodiment, so that a repeated description thereof will be omitted here.

Figure 6:
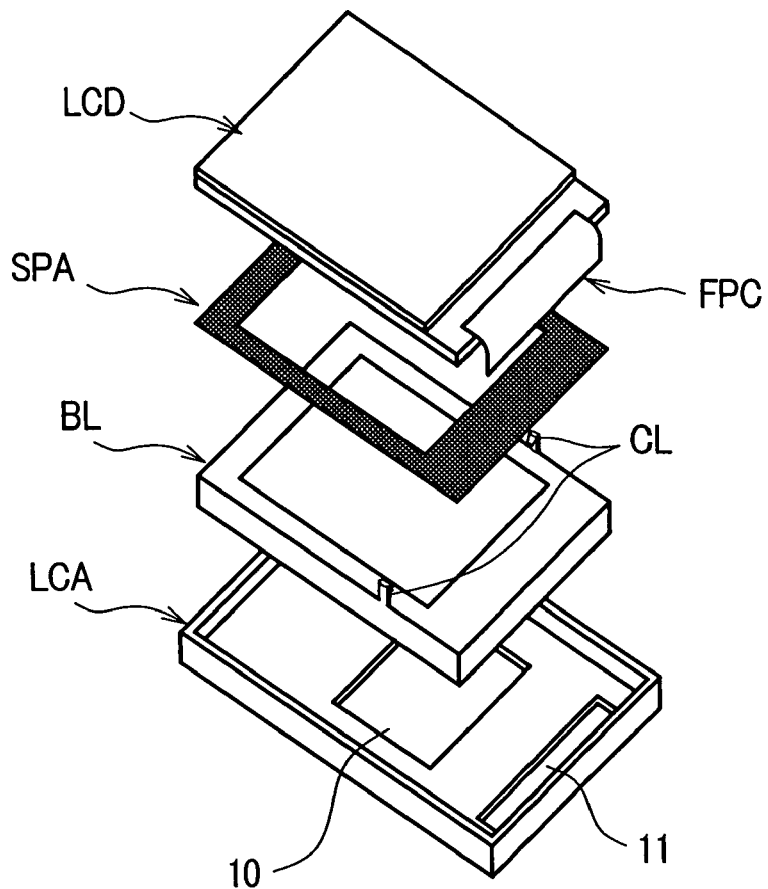
FIG. 6 is a developed perspective view showing a modification of the liquid-crystal display module according to the second embodiment.

FIG. 6 is a developed perspective view showing the structure of a modification of the liquid-crystal display module according to the second embodiment.

The backlight (BL) generally includes an optical waveguide, optical sheets (e.g., an upper diffusion sheet, two lens sheets, and a lower diffusion sheet), and a mold that accommodates the optical waveguide and the optical sheets.

The liquid-crystal display module shown in FIG. 6 has the claws (CL) that fix the liquid-crystal display panel (LCD) on the mold of the backlight (BL).

According to this embodiment, the vertical movement of the liquid-crystal display panel (LCD) can be limited.

Third Embodiment

Figure 7:
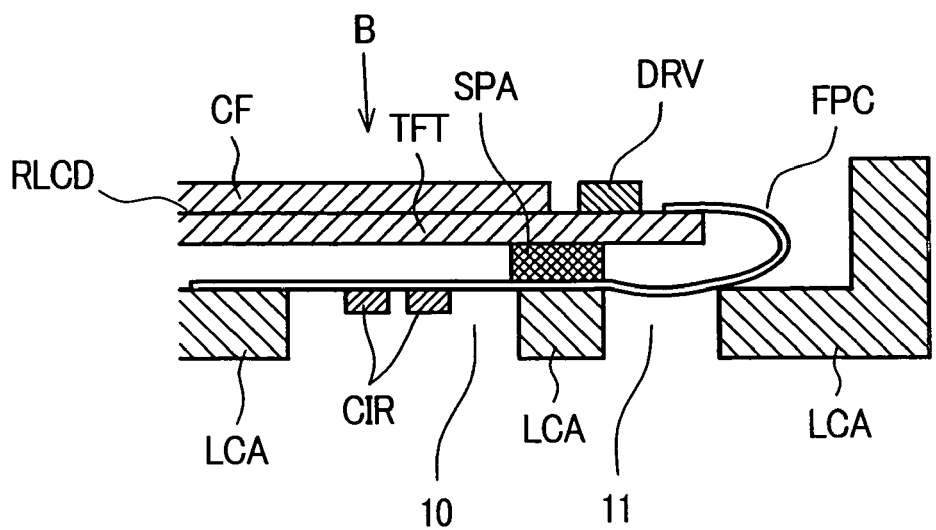
FIG. 7 is a sectional view of a liquid-crystal display module according to a third embodiment of the invention.

FIG. 7 is a sectional view of a liquid-crystal display module according to a third embodiment of the invention, showing section of the same portion as shown in FIG. 13.

The liquid-crystal display module of this embodiment has a reflection liquid-crystal display panel (RLCD) in place of the liquid-crystal display panel (LCD) according to the foregoing embodiments. Accordingly, in this embodiment, the backlight (BL) is omitted, and the flexible printed circuit (FPC) is fixed to the reflection liquid-crystal display panel (RLCD) using the double-coated spacer (SPA).

The other structural features of this embodiment are the same as those of the first embodiment, and so a repeated description thereof will be omitted here.

Also in this embodiment, the flexible printed circuit (FPC) is formed in the area of the hole (or depression) 11 of the die cast frame (LCA) as a deflected portion which projects into the hole 11. Thus, also in this embodiment, the above-described returning stress can be absorbed even when the liquid-crystal display module is made slim, causing the bending radius of the flexible printed circuit (FPC) to be small. Accordingly, the reflection liquid-crystal display panel (RLCD) is prevented from lifting up from the backlight (BL), or the end of the flexible printed circuit (FPC) is prevented from lifting up from the reflection liquid-crystal display panel (RLCD).

Figure 9:
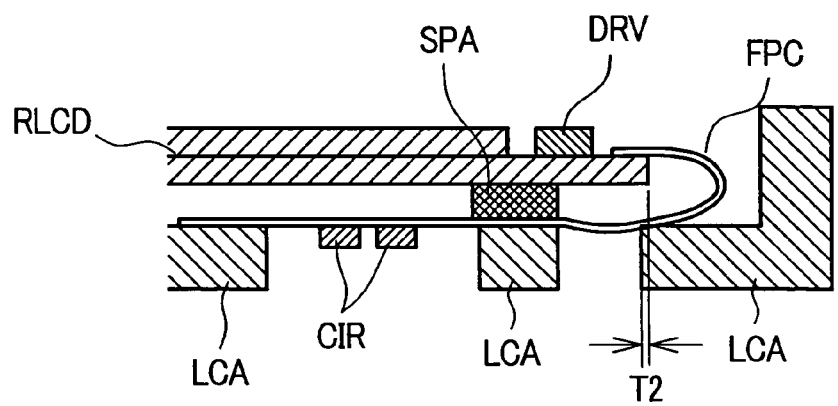
FIG. 9 is a sectional view of another modification of the liquid-crystal display module according to the third embodiment.

In a modification of the embodiment, the hole 11 is located such that the hole 11 does not extend to the terminal side or end surface of the glass substrate (TFT) of the reflection liquid-crystal display panel (RLCD), as seen in plan view (as viewed from the direction of arrow B in FIG. 7). In this case, as shown in FIG. 9, it is preferable that the distance (T2 in FIG. 9) between the end of the hole 11 adjacent to the reflection liquid-crystal display panel (RLCD) and the terminal side of the reflection liquid-crystal display panel (RLCD) be within 2 mm.

Figure 8:
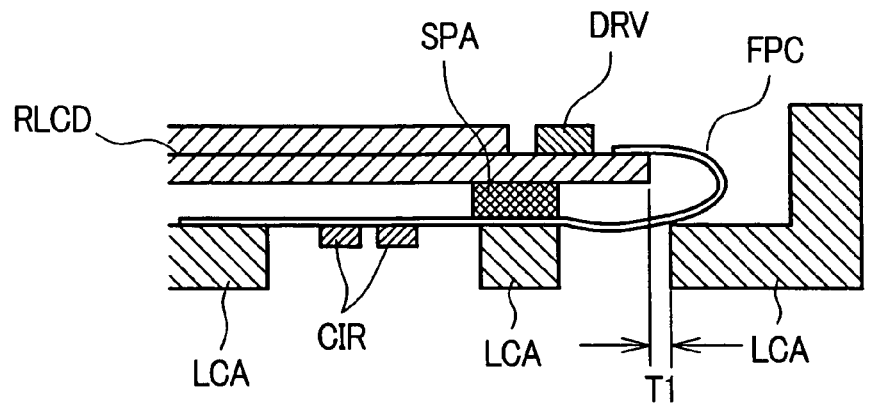
FIG. 8 is a sectional view of a modification of the liquid-crystal display module according to the third embodiment.

In another modification of the embodiment, the hole 11 is located such that the hole 11 extends beyond the terminal side of the glass substrate (TFT) of the reflection liquid-crystal display panel (RLCD), as seen in plan view. In this case, as shown in FIG. 8, it is preferable that the distance (T1 in FIG. 8) between the end of the hole 11 outside the reflection liquid-crystal display panel (RLCD) and the terminal side of the glass substrate (TFT) of the reflection liquid-crystal display panel (RLCD) be within 4 mm.

In this embodiment, the die cast frame (LCA) may have claws to fix the reflection liquid-crystal display panel (RLCD), as shown in FIG. 5.

In this embodiment, an organic electroluminescent (EL) display panel may be used in place of the reflection liquid-crystal display panel (RLCD).

Figure 10:
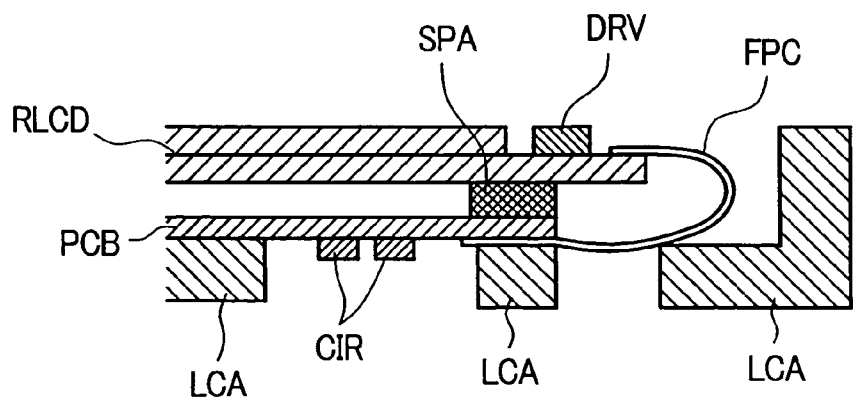
FIG. 10 is a sectional view of still another modification of the liquid-crystal display module according to the third embodiment.

FIG. 10 is a sectional view of still another modification of the liquid-crystal display module according to the third embodiment.

The liquid-crystal display module shown in FIG. 10 is different in construction from the liquid-crystal display module shown in FIG. 7 in that a printed circuit board (PCB) having circuit components (CIRs) is disposed between the reflection liquid-crystal display panel (RLCD) and the die cast frame (LCA) and that the printed circuit board (PCB) is fixed to the reflection liquid-crystal display panel (RLCD) causing a double-coated spacer (SPA). However, the other structural features are the same as those of the liquid-crystal display module of FIG. 7. Accordingly, a repeated description thereof will be omitted here.

The flexible printed circuit (FPC) has no circuit component (CIR) and is used to electrically connect the printed circuit board (PCB) and the reflection liquid-crystal display panel (RLCD).

Figure 11:
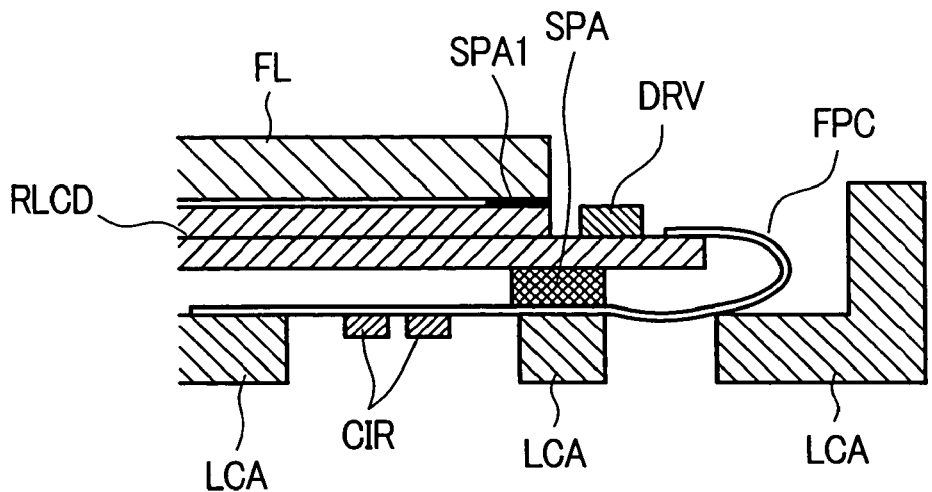
FIG. 11 is a sectional view of yet another modification of the liquid-crystal display module according to the third embodiment.

FIG. 11 is a sectional view of yet another modification of the liquid-crystal display module according to the third embodiment.

The liquid-crystal display module shown in FIG. 11 is different in construction from the liquid-crystal display module shown in FIG. 7 in that a front light (FL) is disposed in front of the reflection liquid-crystal display panel (RLCD) (on the observer side). However, the other structural features thereof are the same as those of the liquid-crystal display module of FIG. 7. Accordingly, a repeated description thereof will be omitted here.

While the present invention has been specifically described based on the preferred embodiments thereof, it is to be understood that the invention is not limited to the foregoing embodiments and various modifications may be made without departing from the spirit or scope of the invention.

What is claimed is:

1. A display device comprising:
   a display panel;
   a backlight disposed on the back of the display panel;
   a flexible printed circuit; and
   a holder that holds the display panel, the backlight, and the flexible printed circuit, wherein
   the flexible printed circuit connects to a first side of the display panel proximate to an end surface of the display panel and is bent in the vicinity of the end surface of the display panel, and part of the flexible printed circuit is disposed between the back of the backlight and the holder;
   the holder has an opening or a depression in the vicinity of an end surface of the backlight corresponding to the end surface of the display panel; and
   the flexible printed circuit deflects so that a portion of the flexible printed circuit projects into a space in the opening or the depression of the holder, as viewed in section.

2. A display device according to claim 1, wherein the opening or the depression of the holder does not overlap with the end surface of the backlight in plan view.

3. A display device according to claim 2, wherein the distance between the end of the opening or the depression of the holder adjacent to the end surface of the backlight and the end surface of the backlight is within 2 mm, in plan view.

4. A display device according to claim 1, wherein the opening or the depression of the holder overlaps with the end surface of the backlight, in plan view.

5. A display device according to claim 4, wherein the distance between the end of the opening or the depression outside the backlight and the end surface of the backlight is within 4 mm, in plan view.

6. A display device according to claim 1, wherein the display panel and the backlight are fixed together with a double-coated tape.

7. A display device according to claim 1, wherein the flexible printed circuit deflects so that the portion of the flexible printed circuit projects into the space in the opening or the depression so as to relieve stress within the display device and substantially prevent separation of parts of the display device.

* * * * *